United States Patent [19]

Muto et al.

[11] Patent Number: 5,168,337

[45] Date of Patent: Dec. 1, 1992

[54] POLYCRYSTALLINE DIODE AND A METHOD FOR MAKING THE SAME

[75] Inventors: Hiroshi Muto, Kariya; Masami Yamaoka, Anjo, both of Japan

[73] Assignee: Nippondenso Co., Ltd., Kariya, Japan

[21] Appl. No.: 865,690

[22] Filed: Apr. 8, 1992

Related U.S. Application Data

[63] Continuation of Ser. No. 734,099, Jul. 23, 1991, abandoned, which is a continuation of Ser. No. 312,658, Feb. 21, 1989, abandoned.

[30] Foreign Application Priority Data

Feb. 19, 1988 [JP] Japan .................. 63-38418

[51] Int. Cl.⁵ .................. H01L 27/01; H01L 27/13; H01L 29/78
[52] U.S. Cl. .................. 257/49
[58] Field of Search .................. 357/20, 59 A, 59 G, 357/58, 23.4, 30 K, 30 B, 14, 58, 59 P, 89, 23.7, 89

[56] References Cited

U.S. PATENT DOCUMENTS

| 4,053,916 | 11/1977 | Cricchi et al. | 357/23.7 |
|---|---|---|---|
| 4,458,261 | 7/1984 | Omura | 357/23.7 |
| 4,489,339 | 12/1984 | Uchida | 357/23.7 |
| 4,492,974 | 1/1985 | Yoshida et al. | |
| 4,591,892 | 5/1986 | Yamazaki | 357/58 |
| 4,600,935 | 7/1986 | Dresner | 357/58 |
| 4,616,404 | 10/1986 | Wang et al. | |
| 4,809,056 | 2/1989 | Shirato et al. | 357/23.7 |
| 4,827,319 | 5/1989 | Pavlidis et al. | 357/14 |

FOREIGN PATENT DOCUMENTS

| 2516620 | 10/1975 | Fed. Rep. of Germany | 357/58 |
|---|---|---|---|
| 57-141962 | 9/1982 | Japan . | |
| 58-151050 | 9/1983 | Japan . | |
| 58-151051 | 9/1983 | Japan . | |
| 61-134079 | 6/1986 | Japan . | |

OTHER PUBLICATIONS

Gerzberg et al., IEEE Electron Device Letters, "A Quantitative Model of the Effect of Grain Size on the Resistivity of Polycrystalline Silicon Resistors", Mar. 1980, vol. EDL-1, No. 3.

Primary Examiner—Jerome Jackson, Jr.
Assistant Examiner—Hung Xuan Dang
Attorney, Agent, or Firm—Cushman, Darby & Cushman

[57] ABSTRACT

A diode which includes a first region formed in a polycrystalline silicon layer formed on a substrate. The diode has a predetermined width W and is one of an intrinsic region and a region including impurities at a low concentration therein, a second region and a third region including P-type impurities and N-type impurities therein respectively and both being oppositely arranged from each other with the first region therebetween in the polycrystalline silicon layer. Electrodes are electrically connected to the second region and the third region respectively, and further the film characteristic of the polycrystalline silicon layer and the predetermined width W thereof are determined in such a manner as to fulfill the following equation:

$$W_D \leq W \leq L$$

L represents a carrier diffusion length and $W_D$ represents a width of the depletion layer created in the polycrystalline silicon layer when the voltage corresponding to the withstand voltage required by the polycrystalline diode as mentioned above, is applied thereto.

6 Claims, 7 Drawing Sheets

POLYCRYSTALLINE DIODE AND A METHOD FOR MAKING THE SAME

This is a continuation of application No. 07/734,099, filed on Jul. 23, 1991, which was abandoned upon the filing hereof, which was a continuation of Ser. No. 07/312,658, filed on Feb. 21, 1989, now abandoned.

BACKGROUND OF THE INVENTION

This invention relates to a polycrystalline diode and especially relates to a polycrystalline diode formed in a polycrystalline silicon layer mounted on a substrate and being capable of use with both forward bias and reverse bias.

Generally speaking, a diode formed in a polycrystalline silicon layer is easily insulated and isolated from another portion by using an oxide film. Therefore, it is often provided in a device for handling a relatively high electrical voltage such as a power MOS transistor or the like, and is used in a part which must be able to withstand high voltage, such as a surge absorber.

However, when forming a diode in a single crystal silicon layer, a region containing a low concentration of impurities is formed between a P-type region containing a high concentration of impurities and an N-type region in order to be able to withstand a high electrical voltage, and the width of the low concentration is sufficient to obtain a predetermined break down voltage (this width can be determined by a depletion layer extended at that time, though it will be less than 10 μm when the withstand voltage thereof is about several tens of volts.)

The diode thus provided has good performance and a low forward resistance even if used with forward bias.

The reason for this is that when the single crystal silicon is used, as the life time of the carrier is long and thus the injection of the carrier is extended up to a distance of several tens of μm beyond the width of the low concentration region, it is not necessary to limit the width of the low concentration region intentionally, and it is sufficient for the width to be set at less than about 10 μm so that the forward resistance does not become too high.

However, when the diode formed in the polycrystalline silicon layer is used with forward bias, in the polycrystalline silicon layer, the life time of the carrier is extremely short because of scattering or trapping as grain boundaries and accordingly, when the method for obtaining a high withstand voltage used in the single crystal silicon as mentioned above is used in this case without any modification, the low concentration region will become resistant, and the forward resistance of the diode will become extremely high because due to the resistance of a polycrystalline silicon having a low concentration of impurities being remarkably higher than that of the single crystal silicon. For example, in U.S. Pat. No. 4,492,974, a polycrystalline diode having a construction as mentioned above is shown, although when a polycrystalline silicon layer is deposited on a substrate utilizing a standard method for forming a polycrystalline silicon layer in which silicon hydride SiH$_4$ is thermally decomposed at a deposition temperature of around 600° C. and a pressure of around 50 Pa with a LPCVD device to deposit to form the polycrystalline silicon layer with a thickness about 1000–4000 Å, the grain of the crystal obtained is less than 0.5 μm and the carrier diffusion length is less than 1 μm, even after the annealing treatment is carried out.

Also, in this polycrystalline diode having such a film characteristic and formed in the polycrystalline silicon layer, when the width of the low concentration region is increased in order to obtain a high break down voltage, a condition in which the carrier diffusion length in the low concentration region is reduced to become smaller than the width thereof, will occur and thus the forward resistance thereof will be remarkably increased.

Accordingly, heretofore, a diode in which the P-type region and the N-type region both containing impurities at a high concentration are contacted directly with each other, is formed, and in this case, as the break down voltage thereof will be around 6 V, a plurality of the diodes thus formed can be used in series in order to obtain a high break down voltage.

Even when a diode is formed with the method mentioned above, as the forward resistance of each diode is determined generally with the consideration of a plurality of diodes connected to each other, the overall size thereof will become large and further, the voltage $V_F$ before the forward current starts to flow will be increased leading to the problem of the efficiency thereof being decreased.

SUMMARY OF THE INVENTION

This invention has been created in view of the problems described above, and the object of this invention is to provide a diode which is formed in a polycrystalline silicon layer and which has a relatively high break down voltage, low forward resistance, and low voltage $V_F$.

To attain the object of the invention as mentioned above, a polycrystalline diode of this invention has a technical construction such that the diode comprises a first region formed in the polycrystalline silicon layer having a predetermined width W either without the impurities, or with the same at a low concentration therein, a second region and a third region including P-type impurities and N-type impurities therein and arranged oppositely from each other with the first region therebetween and the electrodes electrically connected to the second region and the third region respectively, and the diode is further characterized in that the film characteristic of the polycrystalline silicon layer and the predetermined width W in the first region as mentioned above are determined in such a manner as to fulfill the following equation;

$$W_D \leq W \leq L$$

Wherein, L represents a carrier diffusion length and $W_D$ represents a width of the depletion layer created in the polycrystalline silicon layer when the voltage corresponding to the break down voltage required by the polycrystalline diode as mentioned above, is applied thereto.

A method for making the polycrystalline diode of this invention comprises the steps of;

forming a pattern of a polycrystalline silicon layer either without impurities, or with the same at a low concentration therein, on a substrate, increasing a carrier mobility in the polycrystalline silicon layer above, introducing P-type and N-type impurities into a second and third region in the polycrystalline silicon layer as mentioned above, both at high concentration, and both regions being oppositely arranged from each other with the first region having a predetermined width, and forming the electrodes electrically connected to the second and the third region.

According to this invention, as the lowest width of the first region is set at a width equal to the width of the depletion layer created in the polycrystalline silicon layer when the voltage corresponding to the necessary withstand voltage is applied thereto, the withstand voltage can be increased because no punch through phenomenon will occur when voltage is applied as reverse bias to maintain the required withstand voltage of the diode.

Moreover, in this invention, in order to make the carrier diffusion length in the first region longer than the width of the depletion layer, for example, the film characteristic of the polycrystalline silicon layer is determined by enlarging the size of the grains and simultaneously the upper most width of the first region is set at the value corresponding to the carrier diffusion length so that the carrier injection beyond the width of the first region will occur thus reducing the forward resistance.

Further, in this case, a low voltage $V_F$ can be obtained because of there being only one P-N junction and thereby an effect of the diode provided by this invention of having a small device size and being suitable for integration, can be obtained.

DESCRIPTION OF THE PREFERRED EMBODIMENTS

This invention will be explained below by way of examples with reference to the attached drawings.

In the examples below, all explanations will be of a diode suitable for use in automobile having a power source of 12 V, and usually requiring a break down voltage of around 15-20 V, as one embodiment.

Figure 1A:
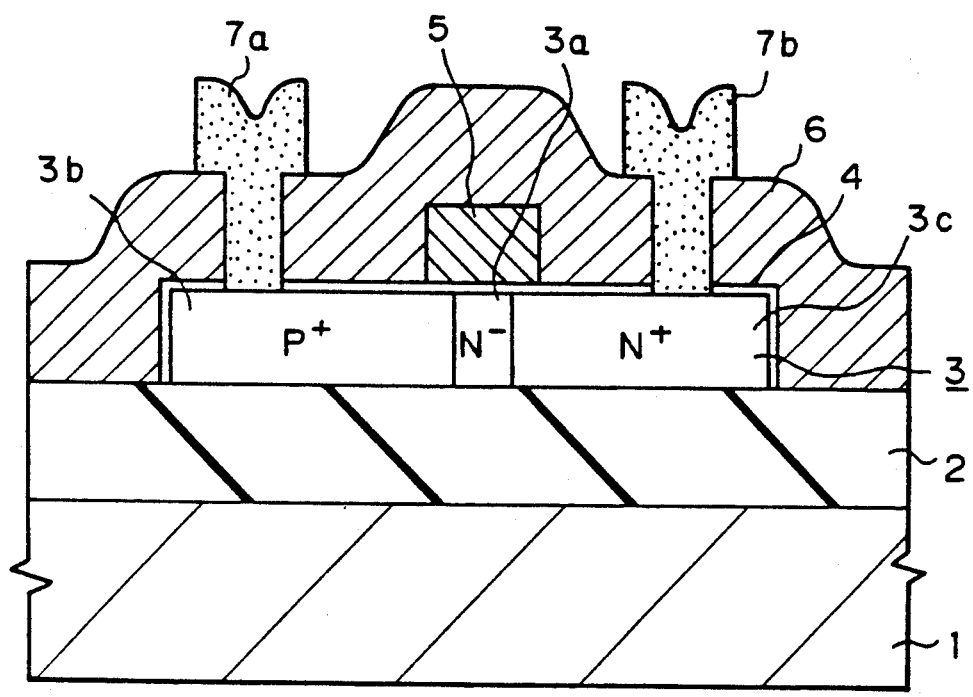
FIGS. 1(a) and 1(b) show a cross sectional view and a plane view of the polycrystalline diode shown in Example 1 of this invention.
Figure 1B:
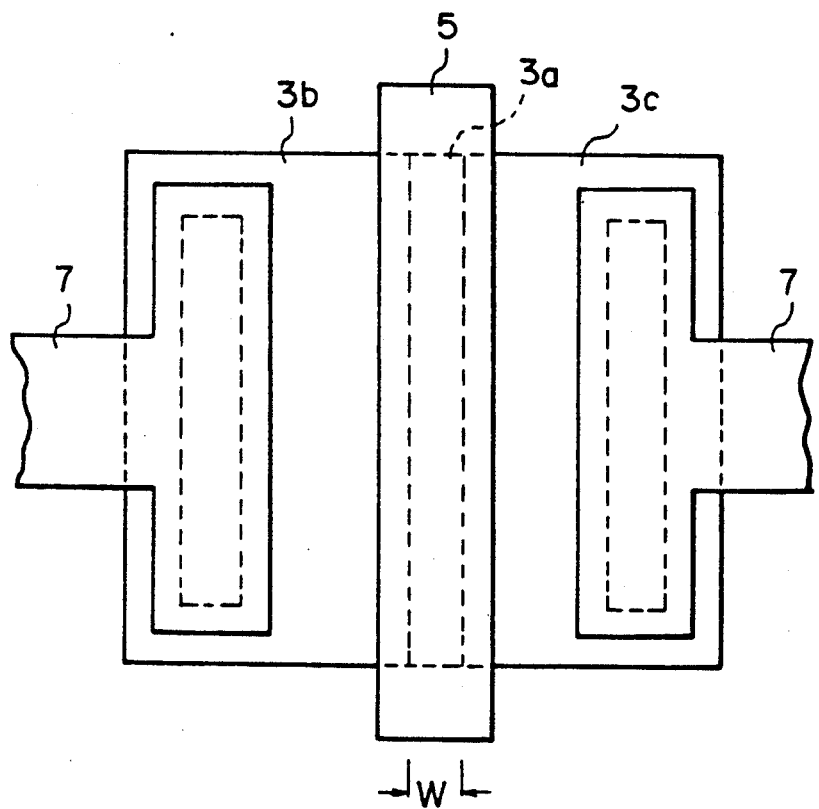

FIG. 1 shows a diode of Example 1 of this invention, FIG. 1(a) shows the cross sectional view thereof, and FIG. 1(b) shows the plane view thereof.

In these Figures, an oxide silicon ($SiO_2$) film 2 is formed on the surface of the single crystal silicon substrate and further a polycrystalline silicon layer 3 is selectively formed on the surface of the oxide silicon film 2.

In the polycrystalline silicon layer 3, a first region 3a including N-type impurities at a low concentration, a second region 3b including P-type impurities at a high concentration, and a third region 3c including N-type impurities at a high concentration are formed respectively.

On the other hand, a thermal oxide film 4, a mask 5 made of polycrystalline silicon, an interlayer insulating film 6 and the electrodes 7a and 7b are respectively provided.

As shown in FIG. 1(b), the width W of the first region 3a is set at for example, 1.5 μm, selected from the allowable range of 0.7-2.0 μm.

Next, the method for producing the diode of Example 1 of the invention will be explained with reference to the cross sectional views shown in FIGS. 2(a) to 2(d).

Figure 2A:
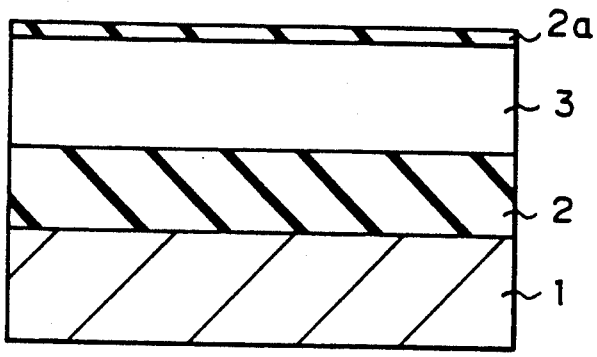
FIGS. 2(a) to 2(d) show cross sectional views indicating the manufacturing method of the Example 1 of this invention.

First, as shown in FIG. 2(a), an oxide silicon film 2 having thickness of about 1 μm is formed on the main surface of the single crystal silicon substrate 1 by a thermal oxidizing method at the temperature of 1050° C., with wet HCl.

Successively, the polycrystalline silicon layer 3 composed of a film having a thickness of 1.75 μm, is formed on the surface of the oxide silicon film 2 utilizing the LPCVD (Low-Pressure Chemical Vapor Deposition) method and thereafter the cap oxide layer 2a is formed on the surface of the polycrystalline silicon layer 3 by a thermal treatment at 1170° C. in an oxygen atmosphere in order to prevent the polycrystalline silicon layer from dropping out of the substrate in the subsequent high temperature thermal treatment.

After that, the polycrystalline silicon layer 3 is further thermally treated at 1170° C. in a $N_2$ atmosphere to enlarge the size of the crystal grain.

At this time, the size of the crystal grain of the polycrystalline silicon layer 3 is crystally grown until the size of the crystal grain thereof is enlarged to about 0.8 μm, in the process of the high temperature thermal treatment.

Figure 2B:
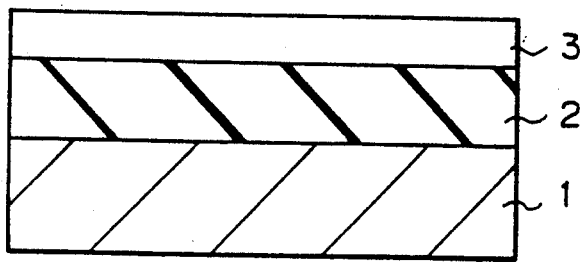

Then, as shown in FIG. 2(b), the polycrystalline silicon layer 3 is etched by the thermal oxidizing method or RIE (Reactive Ion Etching) method for the polycrystalline silicon layer 3 to be reduced to a film thickness of about 7000 Å.

Figure 2C:
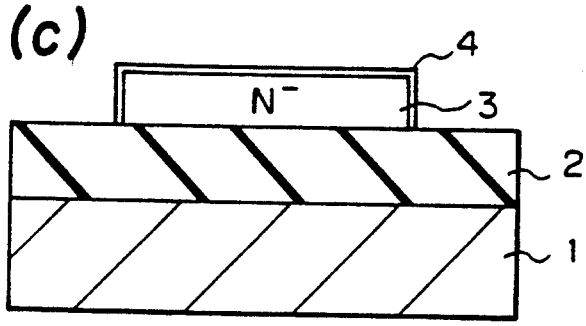

In the next step, as shown in FIG. 2(c), a photoetching treatment is carried out on the polycrystalline silicon layer 3 utilizing the RIE method or the like to reduce the layer 3 to a predetermined configuration followed by the step of forming a thermal oxide film 4 by thermally oxidizing the surface of the polycrystalline silicon layer 3.

Next, N-type impurities such as a phosphorous or the like are implanted into the polycrystalline silicon layer 3 by an ion injecting method SO that the concentration of the impurities in the polycrystalline silicon will become less than $1 \times 10^{18}$ cm$^{-3}$, for example, $5 \times 10^{16}$ cm$^{-3}$, when the concentration is measured utilizing the Hall effect.

While this concentration corresponds to the concentration of the impurity in the first region, the reason why this concentration is set as less than $1 \times 10^{18}$ cm$^{-3}$ is that when the value exceeds that figure, the value of the resistance thereof is sharply reduced and simultaneously the break down voltage thereof is also reduced.

Figure 2D:
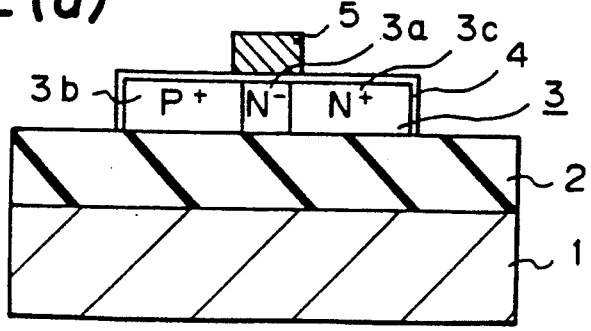

As shown in FIG. 2(d), the polycrystalline silicon layer 5 has a rectangular shape in the plane view on the predetermined surface of the thermal film 4 to make it a mask for use in the ion injection method later explained.

In next step, the second region 3b and the third region 3c are formed by implanting P-type impurities such as B (Boron) or the like, and N-type impurities such as P (phosphorous) or the like, with the mask 5 and both the second region 3b and the third region 3c have impurities at relatively high concentration, such as about $1 \times 10^{20}$ cm$^{-3}$–$1 \times 10^{21}$ cm$^{-3}$ therein.

When the ion injecting method is carried out with a conventional alignment method utilizing photoresist, it is difficult to control the width of the first region $3a$ because the tolerance will be comparatively large, for example $\pm 1.0$ μm, and further the existence of the lateral diffusion of the impurities in the polycrystalline silicon although in the case of the ion implantation using the mask 5 as in this Example 1, the impurities are diffused through self-alignment and therefore the error will be reduced to about $\pm 0.2$ μm, and further the accuracy of the alignment will be increased to set the width of the first region precisely.

Next, the annealing treatment is applied to actuate the implanted impurities for about 30 minutes at 1000° C. in a $N_2$ atmosphere.

As shown in FIG. 1, a BPSG film having a thickness of about 7000 Å for example, is deposited on the surface thereof to form an interlayer insulating film 6, and further, the apertures penetrating the film 6 and extending to the surface of the polycrystalline silicon layer 3 through the thermal oxide film 4 are formed in the film 6, and the diode of the Example 1 will be finally completed by forming the electrodes $7a$ and $7b$ connected to the second region $3b$ and the third region $3c$ through the respective apertures.

The operation of the diode of this Example will be explained next.

When voltage is reversely applied between the electrodes $7a$ and $7b$, the depletion layer will be extended in the P-N junction formed between the first region $3a$ and the second region $3b$, though the depletion layer is dominantly extended in the first region $3a$ because the difference between the concentration of the impurities in both regions is as much as two orders in magnitude.

In this situation, when the width of the depletion layer exceeds the width W of the first region $3a$, the withstand voltage of the diode is determined by the width of the depletion layer, i.e., approximately the same as the width of the first region $3a$, because of the depletion layer contacting the third region $3c$ causing the punch through phenomenon.

Therefore, in this situation, as explained later, the width W of the first region $3a$ is wider than the width of the depletion layer (about 0.7 μm) formed when the voltage corresponding to the required break down voltage (20 V in this example) is applied thereto whereby the break down voltage is determined only by the first region and a withstand voltage is determined only by the first region and a break down voltage of 15–20 V is obtained.

And in this invention, as the size of the crystal grain is grown up to about 0.8 μm by the thermal treatment at a high temperature, the carrier diffusion length in the first region $3a$ will be 2 μm which is larger than the width of the depletion layer (about 0.7 μm) mentioned above.

And moreover, the carrier injection of about 2–3 μm further occurs accordingly when the width W of the first region $3a$ is set at less than 2 μm, and the carrier injection exceeding the width W of the first region $3a$ is realized causing the forward resistance of the diode to be reduced because of the first region not serving as a resistance.

Furthermore, the voltage $V_F$ of the diode will be reduced because of the diode consists of one P-N junction without connecting a plurality of diodes (P-N junctions) directly to each other.

Note, that the explanation above is based upon the object in which the break down voltage of the diode is set at 15–20 V, although if the break down voltage should be determined voluntarily, the lower most limit of the width W of the first region $3a$ may be set as described below.

Namely, it is already known that the width $W_D$ of a depletion layer which must be considered to determine the lower most limit of the width W, is represented by the following equation:

$$W_D = \sqrt{\frac{2K_S \epsilon_0}{q N_A} \cdot V} \quad (1)$$

Therefore, the width $W_D$ of the depletion layer obtained from the break down voltage required may be used as the lower most limit thereof.

In the equation (1) above $K_S$ denotes the dielectric constant of silicon, the value of which being 11.9 assuming that the dielectric constant of the polycrystalline silicon is the same as that of the single crystal silicon, while $\epsilon_0$ denotes the dielectric constant in a vacuum and the value thereof being $8.85 \times 10^{-14}$ F/cm, q denotes the elementary electric charge of $1.6 \times 10^{-19}$ C, and $N_A$ denotes the concentration of impurities in the first region $3a$. On the other hand, the break down voltage V and the concentration of impurities $N_A$ are not independent of each other therefore $N_A$ may be obtained by the following equation (2):

$$N_A = \frac{K_S \epsilon_0 E_C}{2q} (V)^{-1} \quad (2)$$

Wherein, in the equation (2), $E_C$ represents the critical electrical field at which the P-N junction will be broken down and it can be calculated based upon experimental data.

Therefore, for example, when a break down voltage of 20 V is the target of this Example, the width $W_D$ of the depletion layer will be set at about 0.7 μm.

On the other hand, the diffusion length of the carrier considered for determining the upper most limit value of the width W will vary depending upon the film characteristic of the polycrystalline silicon and it can obtained by actual measurement.

For example, the carrier concentration is calculated by actually measuring the Hall mobility thereof, and thereafter the carrier mobility $\mu$ is determined by measuring the resistance thereof.

And finally, the diffusion constant $D_e$ is obtained by utilizing Einstein's following equation:

$$\mu = \frac{q}{KT} D_e \quad (3)$$

Wherein, in equation (3), K represents the Boltzmann's constant of $1.38 \times 10^{-26}$ JK$^{-1}$ and T denotes the absolute temperature.

The life of the carrier $\tau$ is obtained by actually measuring it utilizing the photo decay method or the like, or by utilizing the following equation:

$$J_S = q \cdot n_i \cdot W_b / \tau \quad (4)$$

Wherein, in equation (4), $n_i$ represents the intrinsic carrier concentration and $W_b$ and $J_s$ represent the width of the depletion layer and the current density generated when the predetermined reversed bias is applied thereto respectively, while $W_b$ can be obtained from equation (1) and $J_s$ can be obtained from the leakage current in the reverse direction in the diode.

As mentioned above, the value of $D_e$ and $\tau$ obtained from the equation (3) and (4) above are substituted for the $D_e$ and $\tau$ contained in the following equation:

$$L = \sqrt{D_e \tau} \qquad (5)$$

and the carrier diffusion length L being the upper most limitation value of the width W can be obtained from the following equation (6)

$$L = \sqrt{\frac{KT \mu n_i W_b}{J_s}} \qquad (6)$$

For example, in the Example 1 above, if the specific data are $\mu = 150$ cm$^2$/V sec, $D_e = 4$ cm$^2$/sec, and $\tau = 0.1$ $\mu$sec, the diffusion length L will be 2 $\mu$m.

According to this invention, in order to maintain the required withstand voltage, the lower most limitation value of the width W is first determined utilizing equations (2) and (3), while in order to reduce the forward resistance, it is necessary to set out the carrier mobility $\mu$ in such a way that the carrier diffusion length in the first region will be longer than the lower most limitation value as mentioned above, and it can be attained, for example, by enlarging the size of the crystal grain in the polycrystalline silicon layer.

It is preferable that the upper most limitation value of the width W is set to be less than the carrier diffusion length L formed at this time.

The concept of this relationship mentioned above can be represented in the following equation:

$$W_D \leq W \leq L$$

Accordingly, the film characteristic and the width W of the polycrystalline silicon layer in the first region may be set by fulfilling the equation mentioned above.

Figure 3:
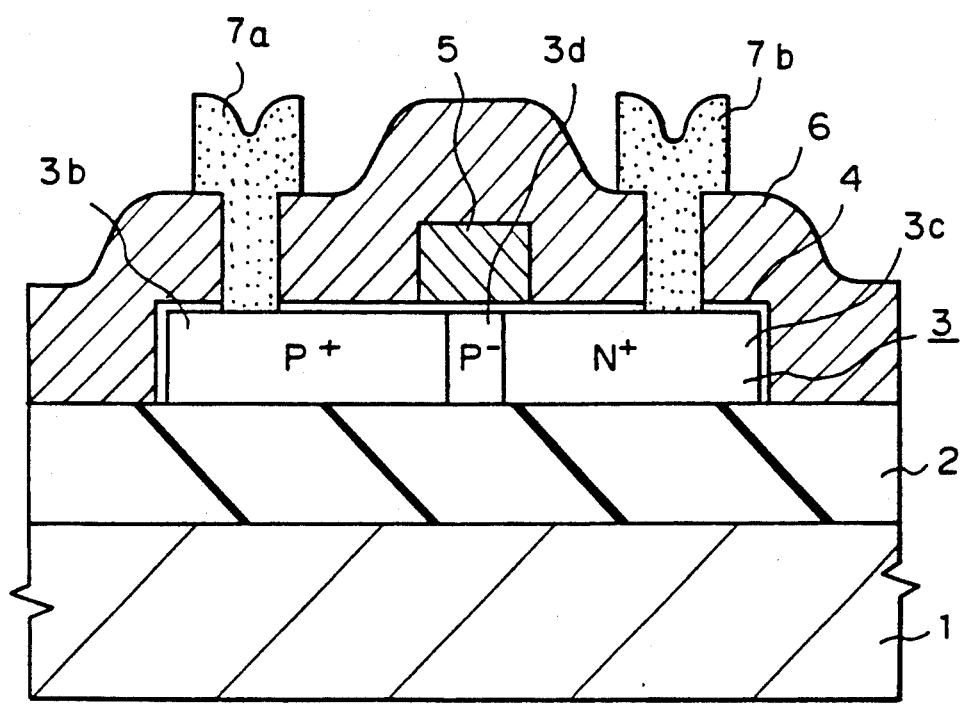
FIG. 3 shows a cross sectional view of the polycrystalline diode shown in Example 2 of this invention.

Next, Example 2 of this invention will be explained with reference to FIG. 3.

In Example 1 mentioned above, the region 3a region, although in this Example, the region 3d containing the P-type impurities is formed as the first region.

The method for making the polycrystalline diode in this Example may be the same as that of Example 1 above, although the concentration of the impurities in the first region 3d used in this Example is $2 \times 10^{16}$ cm$^{-3}$.

Figure 4:
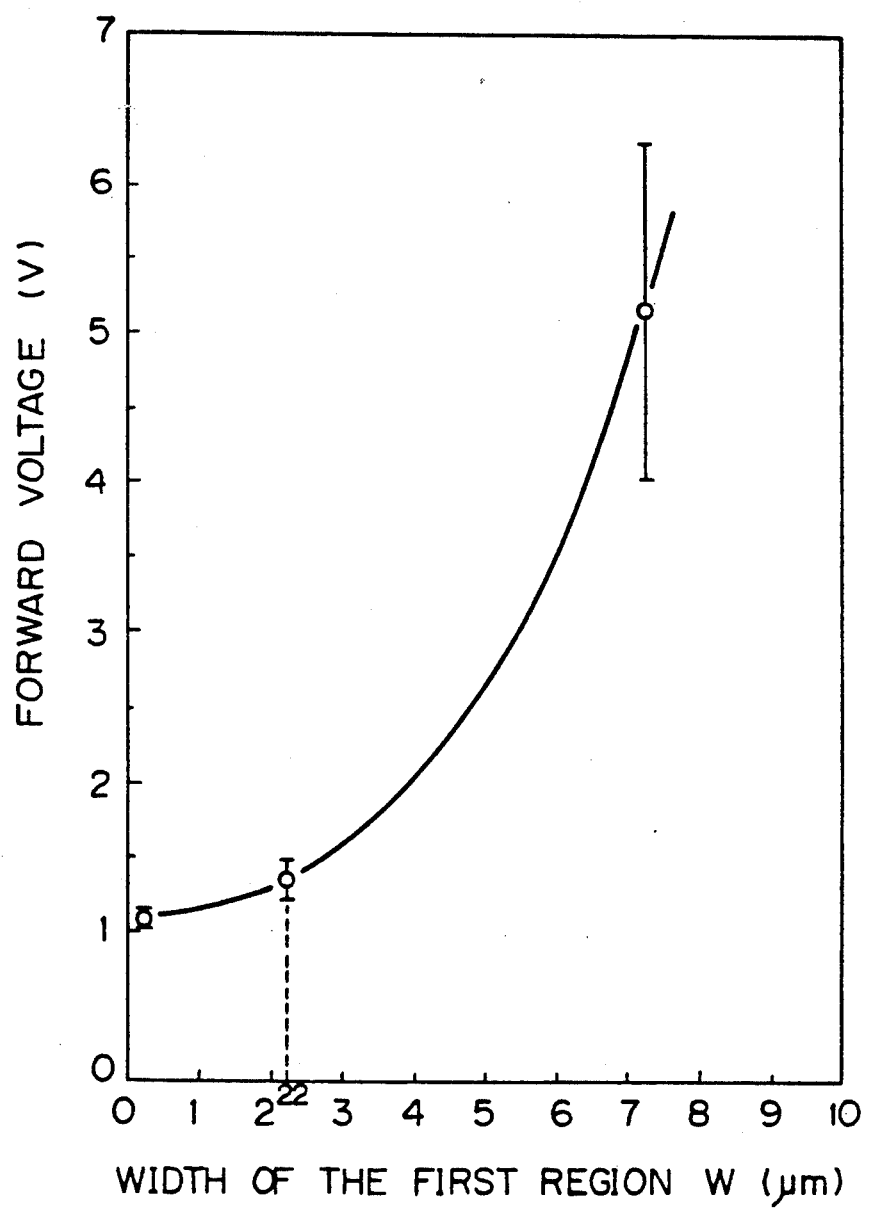
FIG. 4 shows a characteristic chart indicating the relationship between the width of the first region and the forward voltage of the diode.

In FIG. 4, a characteristic chart indicating the forward voltage of the diode measured using the current density of 1 A/cm$^2$ and varying the width W of the first region 3d, is disclosed.

It can be understood that when the concentration of impurities in the first region 3d is set at $2 \times 10^{16}$ cm$^{-3}$, the carrier diffusion length will be about 2.2 $\mu$m, although when the width W thereof exceeds this length, the forward voltage becomes high, and the forward resistance will also become high because of the carrier diffusion length being shorter than the width W.

Figure 5:
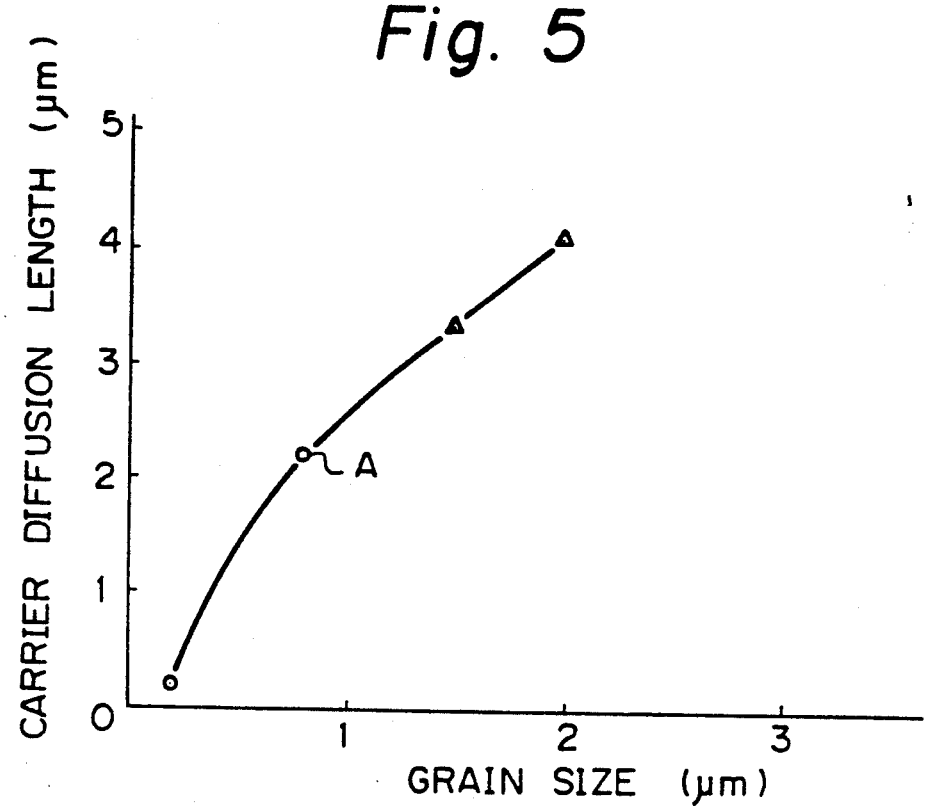
FIG. 5 shows a characteristic chart indicating the relationship between the grain size and the carrier diffusion length.

On the other hand, FIG. 5 shows the relationship between the size of the grain in the polycrystalline silicon layer and the carrier diffusion length, and the circular plot in FIG. 5 is obtained by analyzing the carrier mobility $\mu$ (the Hall Mobility $\mu_M$) from the channel mobility $\mu_{eff}$, while the other plot is obtained by actual measurement, in particular the value of the plot A is that of the diode obtained in Example 2 as mentioned above.

The plot having a triangular shape is obtained from the equation (5) by processing the proportional constant from the value of the circular plot assuming that the life time $\tau$ of the carrier is inversely proportional to the grain size of the polycrystalline silicon layer.

From this chart, it can be understood that as the grain size is increased, the carrier mobility will be increased and the carrier diffusion length will be elongated.

Next, Example 3 of this invention will be explained with reference to FIG. 6.

In this Example, the polycrystalline diode used for preventing the reverse current in a voltage boosting circuit, is disclosed.

Figure 6:
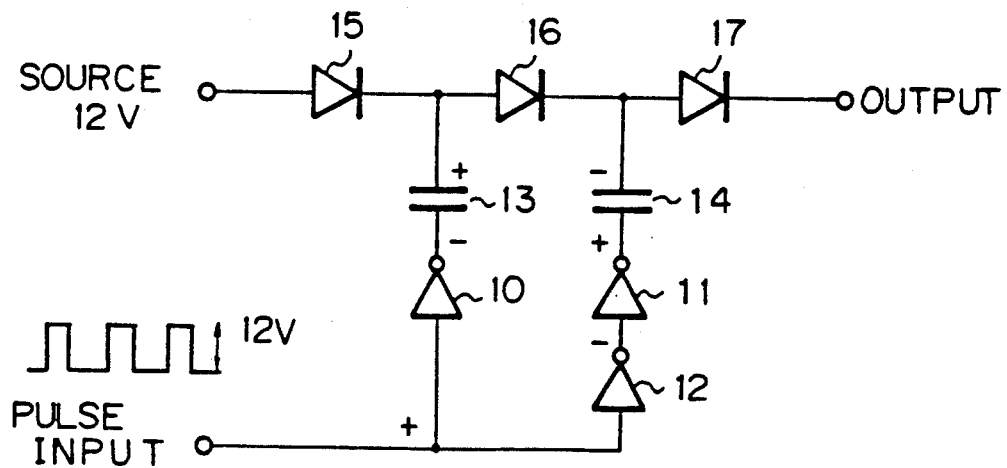
FIG. 6 shows a electric circuit used as a voltage boosting circuit in Example 3 of this invention.

In FIG. 6, the inverters 10, 11 and 12, the capacitances 13, 14, and the polycrystalline diodes 15, 16, and 17 as mentioned above, are provided and when a pulse is applied and the voltage boosting operation is started, an electric current flows through the diodes 15 to 17 in the forward direction, although the electric power consumed by these diodes is low because of the forward resistance thereof being small as mentioned above, whereby a boosted voltage can be efficiently output from the output terminal.

Furthermore, in this Example, the break down voltage of the diode can be set voluntarily depending upon the width W of the first region to realize the prevention of reverse current.

As mentioned above, the usage of the polycrystalline diode of this invention in the voltage boosting circuit is quite effective due to the high break down voltage and the low forward resistance.

When the polycrystalline diode is used in the voltage boosting circuit as in this example, it is generally required that the break down voltage be set to more than double the voltage of the source taking the application of the transient voltage thereto into the account, and therefore, when it is used for automobiles, the width of the first region should be set to between 1.5 and 2.0 $\mu$m due to the withstand voltage thereof being generally required to be more than 30 V in an automobile.

Figure 7:
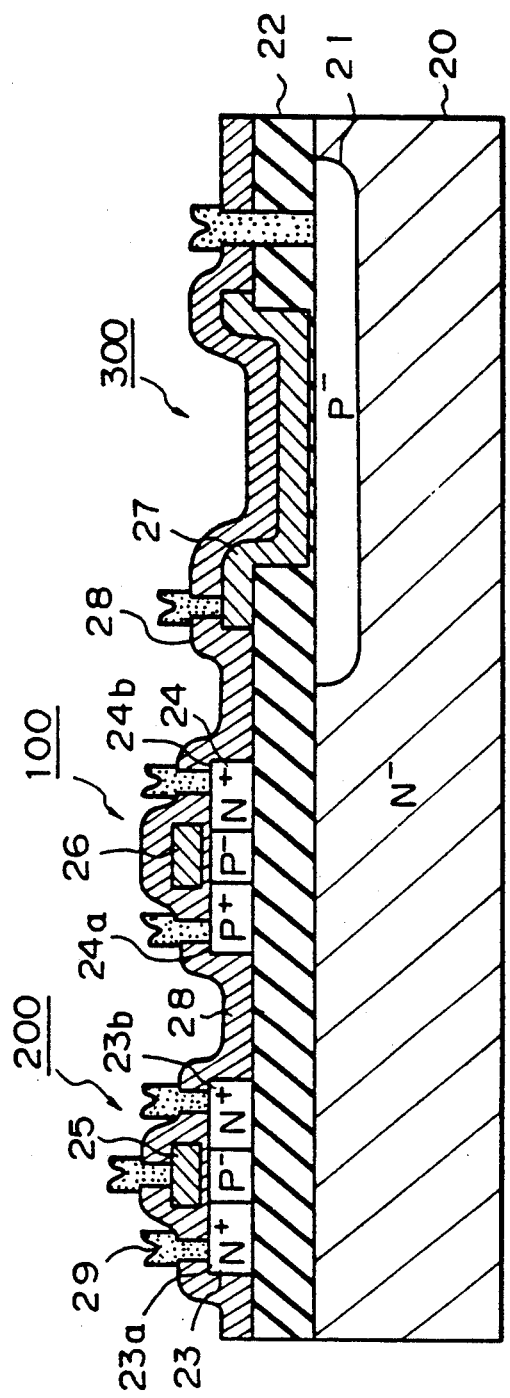
FIG. 7 shows a cross sectional view of the diode in Example 4 of this invention.

Next, Example 4 of this invention will be explained with reference to FIG. 7.

In this Example, the production method thereof has a characteristic figure such as the polycrystalline diode 100, MOSFET 200, and capacitance 300 simultaneously formed on the surface of the same substrate 20.

The method for producing the diode of this invention will next be explained step by step.

First, a P$^-$-type diffusion region 21 is formed in the N$^-$-type Si substrate 20 and thereafter a field oxide film 22 is formed on the main surface of the N$^-$-type Si substrate 20.

Then, the patterns of the polycrystalline silicon layer 23 and 24 are formed on the field oxide film 22.

After that, a part of the field oxide film 22 located on the place in which the capacitance 300 will be formed later, is selectively removed.

Thereafter, to form a gate oxide film, the P-type and N-type impurities having a low concentration are introduced into the polycrystalline silicon layer 23 and 24 respectively.

And then, the polycrystalline silicon layer 25, 26, and 27 are formed on the oxide film located on the predetermined region of the surface of the polycrystalline silicon layer 23, 24 and on the place in which the capacitance 300 will be formed later, respectively.

After that, the N+-type region 23a and 23b used respectively for the source and drain of the MOSFET 200 are formed by injecting the impurities in the polycrystalline silicon layer 23, while the P+-type region 24a and N+-type region 24b respectively are formed by injecting the impurities at a high concentration in the polycrystalline silicon layer 24 using the polycrystalline silicon layer 25 and 26 as masks.

Then, the product thus provided is thermally treated at 1000° C. to diffuse the impurities in each region for its actuation.

The BPSG film 28 serving as an interlayer insulating film is then formed and finally the Al electrodes 29 connected to each region, are formed.

According to this invention, the process steps can be simplified by forming the polycrystalline silicon layer 26 used as a mask simultaneously with forming the polycrystalline silicon layer 25 serving as a gate electrode of the MOSDET 200, and the polycrystalline silicon layer 27 serving as another electrode of the capacitance 300, in order to form the p+-type region 24a and N+-type region 24b in the polycrystalline diode 100.

This invention is explained by way of several examples with reference to the drawings as above, although this invention is not restricted to these examples but there many variations thereof are possible as long as they do not fall out side of the scope of this invention, and this invention may take the several varied embodiments for example such as;

(1) An insulated substrate may be used as a substrate, the polycrystalline silicon layer 3 being formed thereon without using the semiconductor substrate.

(2) The first region of this invention may have the impurities therein at a rather low concentration compared with that in the second and the third region, or may be the region not including any impurities therein, or it may be the I-type (intrinsic) region.

Further, the polycrystalline silicon layer used in this invention, refers to the layer including at least one grain boundary in the first region.

(3) In the Example 1 above, the method indicated in the patent specification of Japanese Patent Application No. 62-70741 (corresponding to the U.S. patent application No. 248,398) is adopted as the method for enlarging the size of the crystal grain in the polycrystalline silicon layer 3 in which the layer is formed with a thickness of more than 0.5 μm and thereafter it is subjected to thermal treatment at a high temperature, although the laser annealing method or the solid phase epitaxy method may be adopted as the method for enlarging the grain size.

We claim:

1. A diode provided in a polycrystalline silicon layer, comprising:
   a substrate;
   an insulating layer provided on one main surface of said substrate;
   a polycrystalline silicon layer formed on the insulating layer, said polycrystalline silicon layer including a P-type region including P-type impurities therein, an N-type region including N-type impurities therein, and a third region between said P-type region and N-type regions;
   a first electrode electrically connected to said P-type region and a second electrode electrically connected to said N-type region;
   wherein said third region formed between said P-type region and said N-type region has a predetermined width W and includes impurities at a concentration which is substantially constant across said width W, and which is at least two orders of magnitude lower than an impurity-concentration of at least one of said P-type region and said N-type region, and further, the width of said region including a film characteristic of said polycrystalline silicon layer, determined in such a manner that the following equation is satisfied:

$$W_D \leq W \leq L$$

wherein, L represents a carrier diffusion length of said third region and $W_D$ represents a width of a depletion layer created in the polycrystalline silicon layer when a voltage corresponding to a breakdown voltage required by said polycrystalline silicon diode is applied thereto in a reverse biased direction.

2. A diode provided in a polycrystalline silicon layer, comprising:
   a substrate;
   an insulating layer provided on one main surface of said substrate;
   a polycrystalline silicon layer formed on the insulating layer;
   a P-type region including P-type impurities therein, and N-type region including N-type impurities therein, and a third region between said P-type region and N-type region;
   electrodes electrically connected to said P-type region and N-type region, respectively;
   said diode being characterized in that said third region is formed so that said region has a predetermined width W and includes impurities at a lower concentration therein than an impurity-concentration of at least one of said P-type region and N-type region, and
   said predetermined width W and a carrier mobility μ of said polycrystalline silicon layer are determined in such a manner that the following equation is satisfied:

$$\sqrt{\frac{2K_s \epsilon_0}{qN_A} \cdot V} \leq W \leq \sqrt{\frac{KT\mu \cdot n_i \cdot W_b}{J_s}}$$

wherein, $K_s$ represents the dielectric constant of the polycrystalline silicon layer, $\epsilon_o$ represents the universal dielectric constant in a vacuum, q represents the elementary electric charge, $N_a$ represents a concentration of impurities in the first region, V represents a required breakdown voltage for the diode, K represents Boltzmann's constant, T represents temperature in degrees Kelvin, μ represents the carrier mobility, $N_i$ represents the intrinsic carrier concentration, $W_b$ represents a width of a depletion layer created in said polycrystalline silicon layer when a voltage corresponding to a breakdown voltage required by said polycrystalline silicon diode is applied thereto in a reverse biased direction and $J_s$ represents current density of the generation current generated when the predetermined voltage is applied thereto.

3. A diode according to claim 1, wherein said concentration of the impurities in said third region is set at $1 \times 10^{18}$ cm$^{-3}$ or less and said concentration of the impurities in said N-type region and said P-type region is set at $1 \times 10^{20}$ cm$^{-3} \sim 1 \times 10^{21}$ cm$^{-3}$.

4. A diode according to claim 2, wherein said concentration of the impurities in said third region is set at $1 \times 10^{18}$ cm$^{-3}$ or less and said concentration of the impurities in said N-type region and said P-type region is set at $1 \times 10^{20}$ cm$^{-3} \sim 1 \times 10^{21}$ cm$^{-3}$.

5. A diode provided in a polycrystalline silicon layer, said diode having a withstand voltage of 15 to 20 volts, said diode comprising:

a substrate;

a polycrystalline silicon layer formed on the insulating layer;

a first region with a constant dopant concentration formed in the polycrystalline silicon layer, said first region having a predetermined width W and being one of an intrinsic region and a region including impurities at a low concentration therein, and said first region being formed so that the predetermined width W has a length less than a carrier diffusion length, the predetermined width satisfying the relationship:

$$0.7 \ \mu m \leqq W \leqq 2.0 \ \mu m;$$

a second region including P-type impurities therein and a third region including N-type impurities therein, said second and third regions being oppositely arranged from each other with the first region therebetween; and electrodes electrically connected to the second region and the third region respectively.

6. A diode provided in a polycrystalline silicon layer, said diode used for preventing a reveres current in a voltage boosting circuit in an automobile, said diode comprising:

a substrate;

a polycrystalline layer formed on the substrate;

a first region with a constant dopant concentration formed in the polycrystalline silicon layer, said first region having a predetermined width W and being one of an intrinsic region and a region including impurities at a low concentration therein, and said first region being formed so that the predetermined width W thereof is at a length less than a carrier diffusion length, and satisfies the relationship:

$$1.5 \ \mu m \leqq W \leqq 2.0 \ \mu m;$$

a second region including P-type impurities and a third region including N-type impurities therein respectively, said second and third regions being oppositely arranged from each other with the first region therebetween; and electrodes electrically connected to the second region and the third region respectively.

* * * * *